(12) United States Patent
Hull et al.

(10) Patent No.: US 11,069,463 B2
(45) Date of Patent: Jul. 20, 2021

(54) HYBRID WOUND-ROTOR MOTOR AND GENERATOR WITH INDUCTION FEED AND PERSISTENT CURRENT

(71) Applicant: The Boeing Company, Chicago, IL (US)

(72) Inventors: John R. Hull, Sammamish, WA (US); Shengyi Liu, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 218 days.

(21) Appl. No.: 16/455,471

(22) Filed: Jun. 27, 2019

(65) Prior Publication Data

US 2020/0411219 A1 Dec. 31, 2020

(51) Int. Cl.
*H01F 6/06* (2006.01)
*H01F 6/00* (2006.01)
*H01F 6/04* (2006.01)
*G01R 33/12* (2006.01)

(52) U.S. Cl.
CPC .............. *H01F 6/06* (2013.01); *H01F 6/005* (2013.01); *H01F 6/04* (2013.01); *G01R 33/1238* (2013.01)

(58) Field of Classification Search
CPC ... H01F 6/06; H01F 6/005; H01F 6/04; G01R 33/1238; Y02E 40/60; H02K 55/04
See application file for complete search history.

(56) References Cited

U.S. PATENT DOCUMENTS 3,742,265 A * 6/1973 Smith, Jr. .............. H02K 55/00
310/52
2003/0052568 A1 3/2003 Howard

FOREIGN PATENT DOCUMENTS

EP 0508936 10/1992
EP 2001121 12/2008
EP 2523322 11/2012
(Continued)

OTHER PUBLICATIONS

Coombs T A et al.: "The Next Generation of Superconducting Permanent Magnets: The Flux Pumping Method", IEEE Transactions on Applied Superconductivity, IEEE Service Center, Los Alamitos, CA, US, vol. 19, No. 3, Jun. 1, 2009, pp. 2169-2173.
(Continued)

*Primary Examiner* — Mohamad A Musleh
(74) *Attorney, Agent, or Firm* — Haynes and Boone, LLP

(57) ABSTRACT

In one or more embodiments, a system for operation in a generator mode comprises a cryocooler to cool a superconducting coil. The system further comprises a flux pump to provide flux to the superconducting coil. Also, the system comprises a shaft of a prime mover to receive torque to rotate a rotor. In addition, the system comprises the superconducting coil to electrically interact with a main stator coil through a rotating magnetic field. Further, the system comprises a control stator coil to receive a current from a controller and to electrically interact with a non-superconducting coil. In one or more embodiments, a magnitude, phase, and/or frequency of rotating magnetic fields of the superconducting coil and the non-superconducting coil is varied in comparison to a magnitude, phase, and/or frequency of the magnetic field produced by the superconducting coil alone to control a magnitude, phase, and/or frequency of an output voltage.

22 Claims, 8 Drawing Sheets

(56) References Cited

FOREIGN PATENT DOCUMENTS

KR    2017/0050551    5/2017
WO    WO 2013/012823    1/2013

OTHER PUBLICATIONS

Ronghai Qu et al.: "Review of Superconducting Generator Topologies for Direct-Drive Wind Turbines", IEEE Transactions on Applied Superconductivity, IEEE Service Center, Los Alamitos, CA, US, vol. 23, No. 3, Jun. 1, 2013, p. 5201108, 8 pages.
Cesar A Luongo et al.: "Next Generation More-Electric Aircraft: A Potential Application for HTS Superconductors", IEEE Transactions on Applied Superconductivity, IEEE Service Center, Los Alamitos, CA, US, vol. 19, No. 3, Jun. 1, 2009, pp. 1055-1068.
Bumby et al.; "Through-Wall Excitation of a Magnet Coil by an External-Rotor HTS Flux Pump"; IEEE Transactions on Applied Superconductivity, vol. 26, No. 4, Jun. 2016; 5 pages.

* cited by examiner

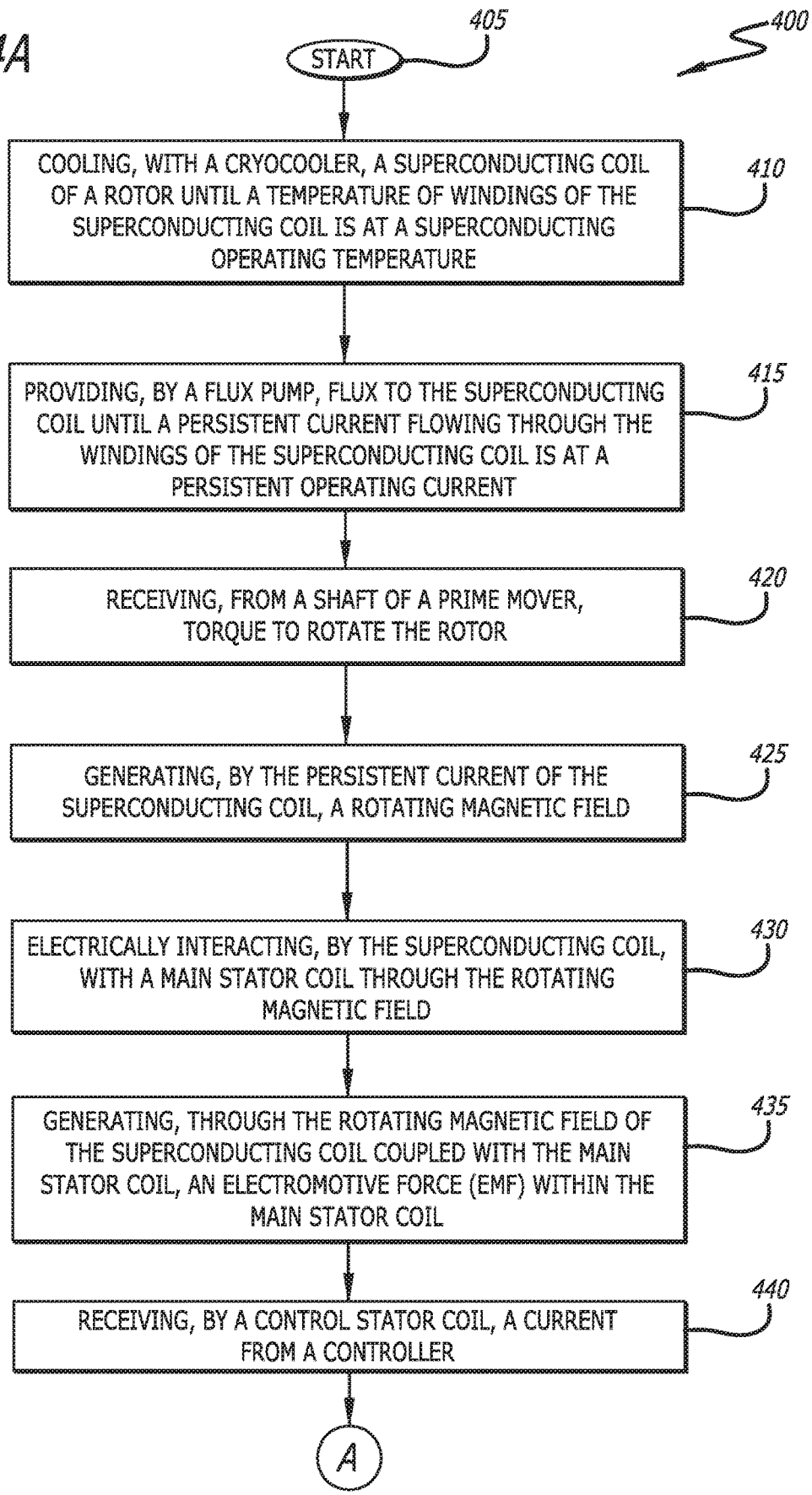

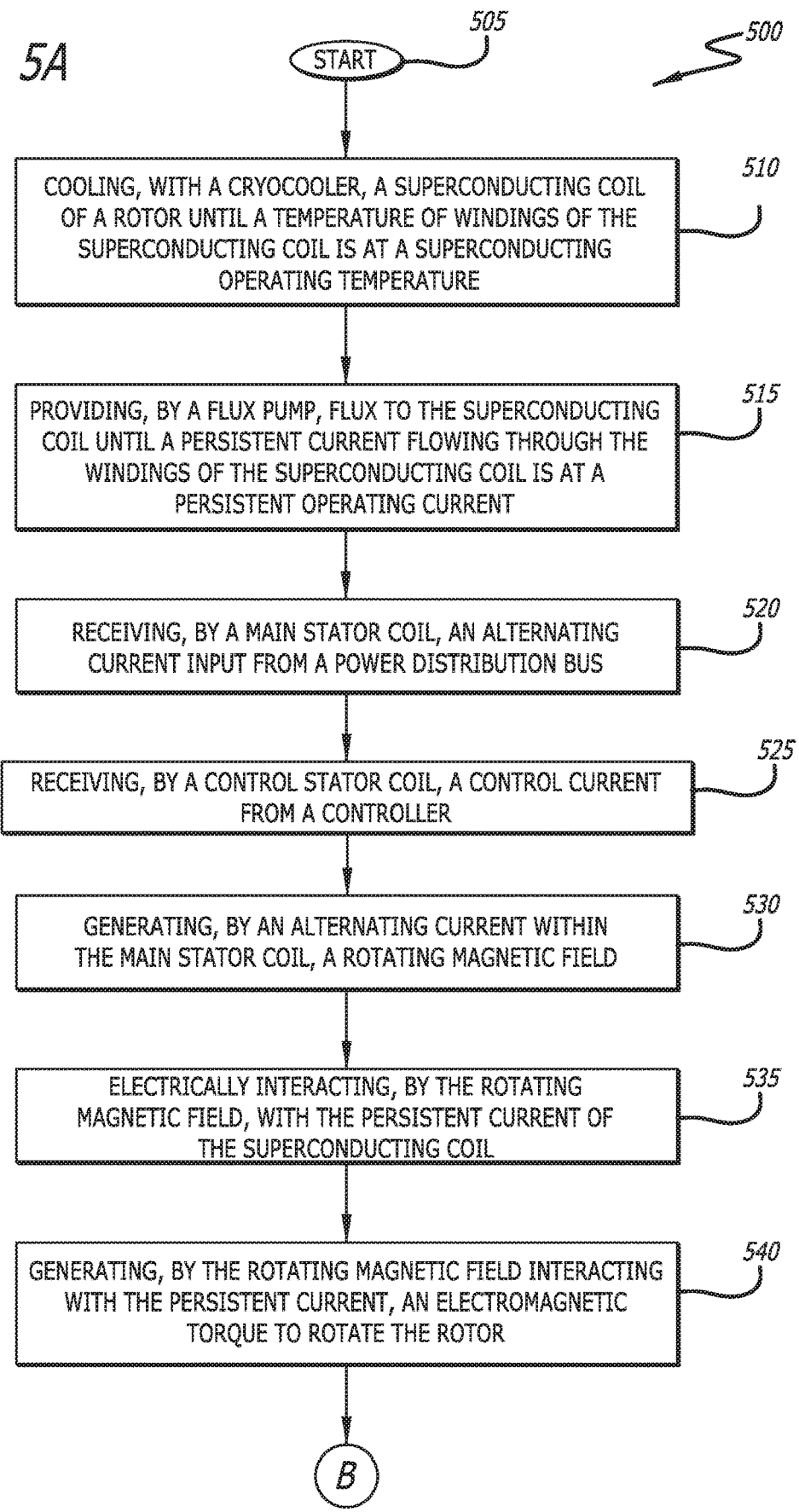

HYBRID WOUND-ROTOR MOTOR AND GENERATOR WITH INDUCTION FEED AND PERSISTENT CURRENT

FIELD

The present disclosure relates to rotor motor/generators. In particular, the present disclosure relates to a hybrid wound-rotor motor/generator with induction feed and persistent current.

BACKGROUND

In the effort to increase use of electrical propulsion in aircraft, there is a continued desire to develop technology that has a higher specific power. Examples include high power density electric motors and generators (M/Gs) and power conversion equipment.

Superconducting windings in a motor/generator (M/G) are often desired to achieve high specific power. The current density in a superconductor is much larger than that of a conventional conductor, such as copper or aluminum, and the power is generally a function of the current in the rotor and the current in the stator windings. Superconducting windings are typically implemented in the rotor, which sees a mostly constant magnetic field and, therefore, has low losses. Since the superconductors require cryogenic temperatures to remain in their superconducting state, any losses require a cooling device, such as a cryocooler to remove the heat. However, if the losses are very high, the weight of the cryocooler offsets the weight advantage of the superconducting device.

Typically, the stator windings for these superconducting M/Gs are conventional conductors, where the stator sees a substantial changing magnetic field. In most designs, the losses due to these changes are too high with present day superconductors to include them in the stator windings.

Currently, one method of establishing current in a wound rotor is through the use of brushes. In addition to the maintenance problem due to wear on the brushes, the presence of a normal conductor running current into a superconducting winding introduces a substantial amount of heat to the system, which much be removed by a refrigeration system. This typically means the design must be composed of many turns, which produces a high inductance and low current.

One method to avoid the introduction of current into the rotor is to use superconductors in the form of bulk trapped-flux magnets, analogous to power permanent magnets. This concept is problematic because it is difficult to energize the superconductors in-situ. Further, it is difficult to turn off the magnetization in a short time. So, if there is a short circuit in the stator windings, the magnetic field from the rotor will continue to impress a voltage across these coils, and there is the danger that the stator windings will overheat and possibly catch on fire.

An alternative method is to use induction to energize the rotor windings. However, the changing field that the superconductors see induces large losses, which makes the cooling system too heavy.

In light of the foregoing, there is a need for an improved high power density electric M/G design.

SUMMARY

The present disclosure relates to a method, system, and apparatus for a hybrid wound-rotor motor/generator with induction feed and persistent current. In one or more embodiments, a method for operation of a device in a generator mode comprises cooling, with a cryocooler, a superconducting coil of a rotor until a temperature of windings of the superconducting coil is at a superconducting operating temperature. The method further comprises providing, by a flux pump, flux to the superconducting coil until a persistent current flowing through the windings of the superconducting coil is at a persistent operating current. Also, the method comprises receiving, from a shaft of a prime mover, torque to rotate the rotor. In addition, the method comprises generating, by the persistent current of the superconducting coil and rotation of the rotor, a rotating magnetic field. Additionally, the method comprises electrically interacting, by the superconducting coil, with a main stator coil through the rotating magnetic field. Also, the method comprises generating, through the rotating magnetic field of the superconducting coil coupled with the main stator coil, an electromotive force (EMF) within the main stator coil. Also, the method comprises receiving, by a control stator coil, a current from a controller. Additionally, the method comprises electrically interacting, by the control stator coil, with a non-superconducting coil of the rotor. Also, the method comprises inducing, by a magnetic field of a current of the control stator coil, a controlling current within the non-superconducting coil. In addition, the method comprises generating, by the controlling current within the non-superconducting coil, a magnetic field to couple with the main stator coil. Additionally, the method comprises modulating, by the magnetic field produced by the controlling current within the non-superconducting coil, a magnetic field produced by the superconducting coil. Further, the method comprises varying at least one of magnitude, phase, or frequency of a combination of rotating magnetic fields of the superconducting coil and the non-superconducting coil in comparison to at least one of a magnitude, phase, or frequency of the magnetic field produced by the superconducting coil alone to control at least one of magnitude, phase, or frequency of an output voltage.

In one or more embodiments, the main stator coil is connected to and delivers electric power to a power distribution bus. In at least one embodiment, control stator coil terminals are connected to the controller. In some embodiments, the control stator coil is connected to the controller and receives at least one control signal from a system controller. In one or more embodiments, the output voltage is outputted at main stator coil terminals.

In at least one embodiment, when the superconducting coil electrically interacts with the main stator coil, the superconducting coil acts as a constant source of magnetic flux. In one or more embodiments, the superconducting coil electrically interacts mostly synchronously with the main stator coil. In some embodiments, the superconducting coil electrically interacts asynchronously with the main stator coil.

In one or more embodiments, the main stator coil is one of superconducting or non-superconducting. In some embodiments, the control stator coil is one of superconducting or non-superconducting.

In at least one embodiment, the flux pump is located one of axially of the rotor or radially of the rotor. In some embodiments, the cryocooler is one of located on the rotor or is stationary.

In one or more embodiments, the method further comprises powering, by slip rings, the cryocooler, when the cryocooler is located on the rotor. In some embodiments, the method further comprises powering, by inductive power transfer, the cryocooler.

In at least one embodiment, the method further comprises flowing, from the cryocooler via a passage, a cooling gas to a cold part of the rotor that comprises the superconducting coil. In some embodiments, the passage connects from the cryocooler to one of an outer radius of the rotor or a rotational axis of the rotor.

In one or more embodiments, the controlling current controls the non-superconducting coil to one of: reinforce a voltage produced in the main stator coil by the superconducting coil, suppress the voltage produced in the main stator coil by the superconducting coil, or change a phase of the voltage produced in the main stator coil by the superconducting coil.

In at least one embodiment, the method further comprises detecting a short circuit in the main stator coil. Also, the method comprises inducing, by the control stator coil, the controlling current into the non-superconducting coil such that flux from the non-superconducting coil entering into a shorted part of the main stator coil is opposite to flux from the superconducting coil entering into the shorted part of the main stator coil. Further, the method comprises simultaneously decreasing, by the flux pump, the persistent current in the superconducting coil until the persistent current in the superconducting coil is reduced to zero, and adjusting the controlling current in the control stator coil to continue to null out the flux from the superconducting coil entering into the shorted part of the main stator coil.

In one or more embodiments, the superconducting coil is located in a cold part of the rotor and the non-superconducting coil is located in a warm part of the rotor. In some embodiments, the cold part of the rotor and the warm part of the rotor are separated by an insulating partition.

In at least one embodiment, the rotor comprises an outer mechanical shell and an inner mechanical shell, and where a cooling gas from the cryocooler flows in a space formed between the outer mechanical shell and the inner mechanical shell.

In one or more embodiments, a system for operation in a generator mode comprises a cryocooler to cool a superconducting coil of a rotor until a temperature of windings of the superconducting coil is at a superconducting operating temperature. The system further comprises a flux pump to provide flux to the superconducting coil until a persistent current flowing through the windings of the superconducting coil is at a persistent operating current. Also, the system comprises a shaft of a prime mover to receive torque to rotate the rotor. In one or more embodiments, the persistent current of the superconducting coil generates a rotating magnetic field. In addition, the system comprises the superconducting coil to electrically interact with a main stator coil through the rotating magnetic field, where the rotating magnetic field of the superconducting coil coupled with the main stator coil generates an electromotive force (EMF) within the main stator coil. Further, the system comprises a control stator coil to receive a current from a controller and to electrically interact with a non-superconducting coil of the rotor, where a magnetic field of a current of the control stator coil induces a controlling current within the non-superconducting coil. In one or more embodiments, the controlling current within the non-superconducting coil generates a magnetic field to couple with the main stator coil, and the magnetic field produced by the controlling current within the non-superconducting coil modulates a magnetic field produced by the superconducting coil. In at least one embodiment, at least one of magnitude, phase, or frequency of a combination of rotating magnetic fields of the superconducting coil and the non-superconducting coil varies in comparison to at least one of a magnitude, phase, or frequency of the magnetic field produced by the superconducting coil alone to control at least one of magnitude, phase, or frequency of an output voltage.

In at least one embodiment, a method for operation of a device in a motor mode comprises cooling, with a cryocooler, a superconducting coil of a rotor until a temperature of windings of the superconducting coil is at a superconducting operating temperature. The method further comprises providing, by a flux pump, flux to the superconducting coil until a persistent current flowing through the windings of the superconducting coil is at a persistent operating current. Also, the method comprises receiving, by a main stator coil, an alternating current input from a power distribution bus. In addition, the method comprises receiving, by a control stator coil, a control current from a controller. Additionally, the method comprises generating, by an alternating current within the main stator coil, a rotating magnetic field. Also, the method comprises electrically interacting, by the rotating magnetic field, with the persistent current of the superconducting coil. In addition, the method comprises generating, by the rotating magnetic field interacting with the persistent current, an electromagnetic torque to rotate the rotor. Additionally, the method comprises generating, by the control stator coil, a current at a non-superconducting coil of the rotor. In addition, the method comprises modulating, by a magnetic field produced by the current of the non-superconducting coil, a magnetic field produced by the alternating current of the main stator coil. Further, the method comprises varying at least one of magnitude, phase, or frequency of a combination of the rotating magnetic field of the main stator coil and the magnetic field of the non-superconducting coil in comparison to at least one of a magnitude, phase, or frequency of the rotating magnetic field produced by the main stator coil alone to control a speed of the rotor.

In one or more embodiments, main stator coil terminals of the main stator coil are connected to the power distribution bus. In some embodiments, control stator coil terminals of the control stator coil are connected to the controller.

In at least one embodiment, a system for operation in a motor mode comprises a cryocooler to cool a superconducting coil of a rotor until a temperature of windings of the superconducting coil is at a superconducting operating temperature. The system further comprises a flux pump to provide flux to the superconducting coil until a persistent current flowing through the windings of the superconducting coil is at a persistent operating current. Also, the system comprises a main stator coil to receive an alternating current input from a power distribution bus. In addition, the system comprises a control stator coil to receive a control current from a controller. In one or more embodiments, an alternating current within the main stator coil generates a rotating magnetic field, the rotating magnetic field electrically interacts with the persistent current of the superconducting coil, and the rotating magnetic field interacting with the persistent current generates an electromagnetic torque to rotate the rotor. Also, in the system, the control stator coil is further to generate a current at a non-superconducting coil of the rotor, where a magnetic field produced by the current of the non-superconducting coil modulates a magnetic field produced by the alternating current of the main stator coil. In one or more embodiments, at least one of magnitude, phase, or frequency of a combination of the rotating magnetic field of the main stator coil and the magnetic field of the non-superconducting coil varies in comparison to at least one of a magnitude, phase, or frequency of the rotating magnetic field produced by the main stator coil alone to control a speed of the rotor.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

Figure 4B:
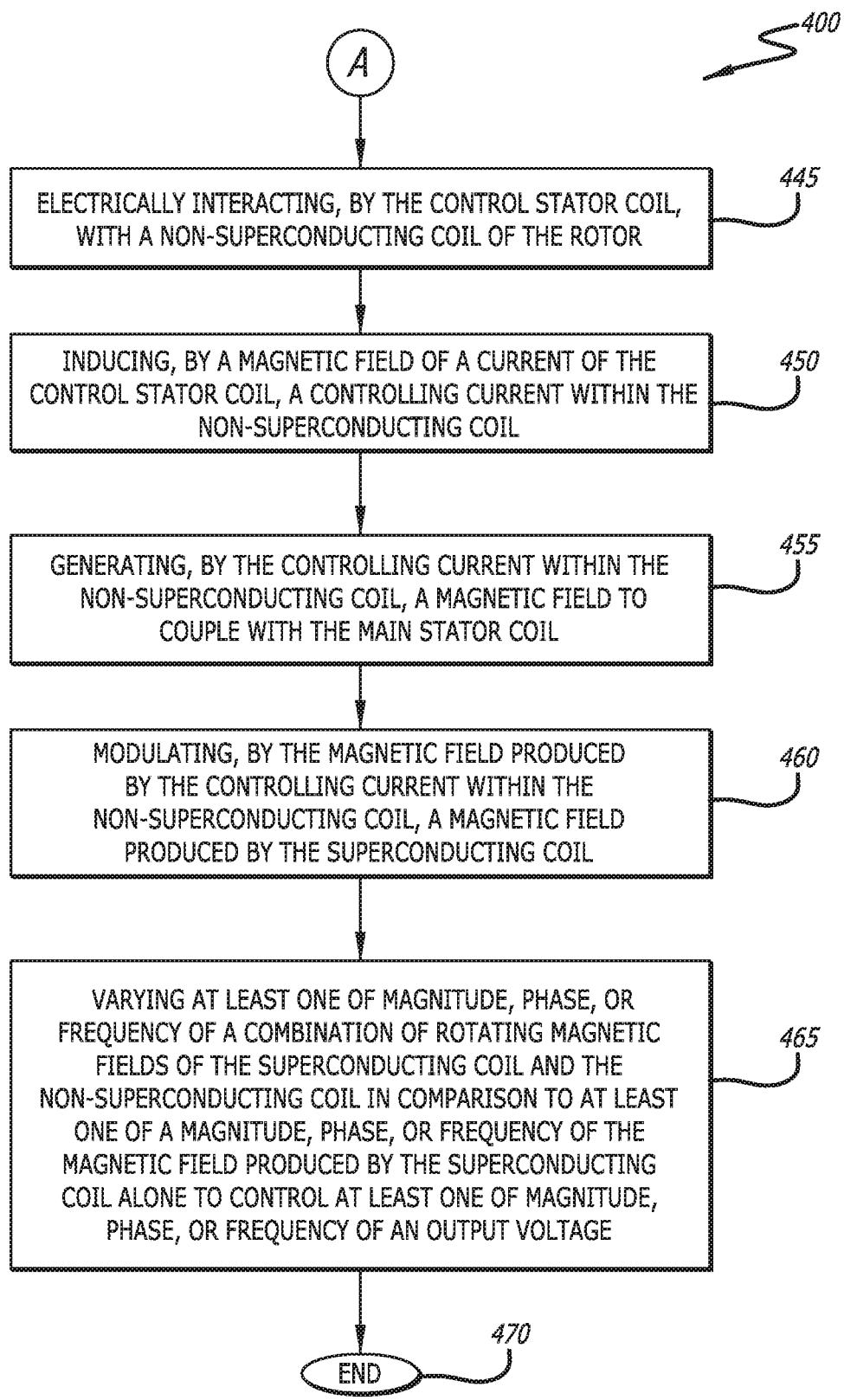

FIGS. 4A and 4B together are a flow chart showing the disclosed method for operation of the disclosed hybrid wound-rotor motor/generator (M/G) in a generator mode, in accordance with at least one embodiment of the present disclosure.

Figure 5B:
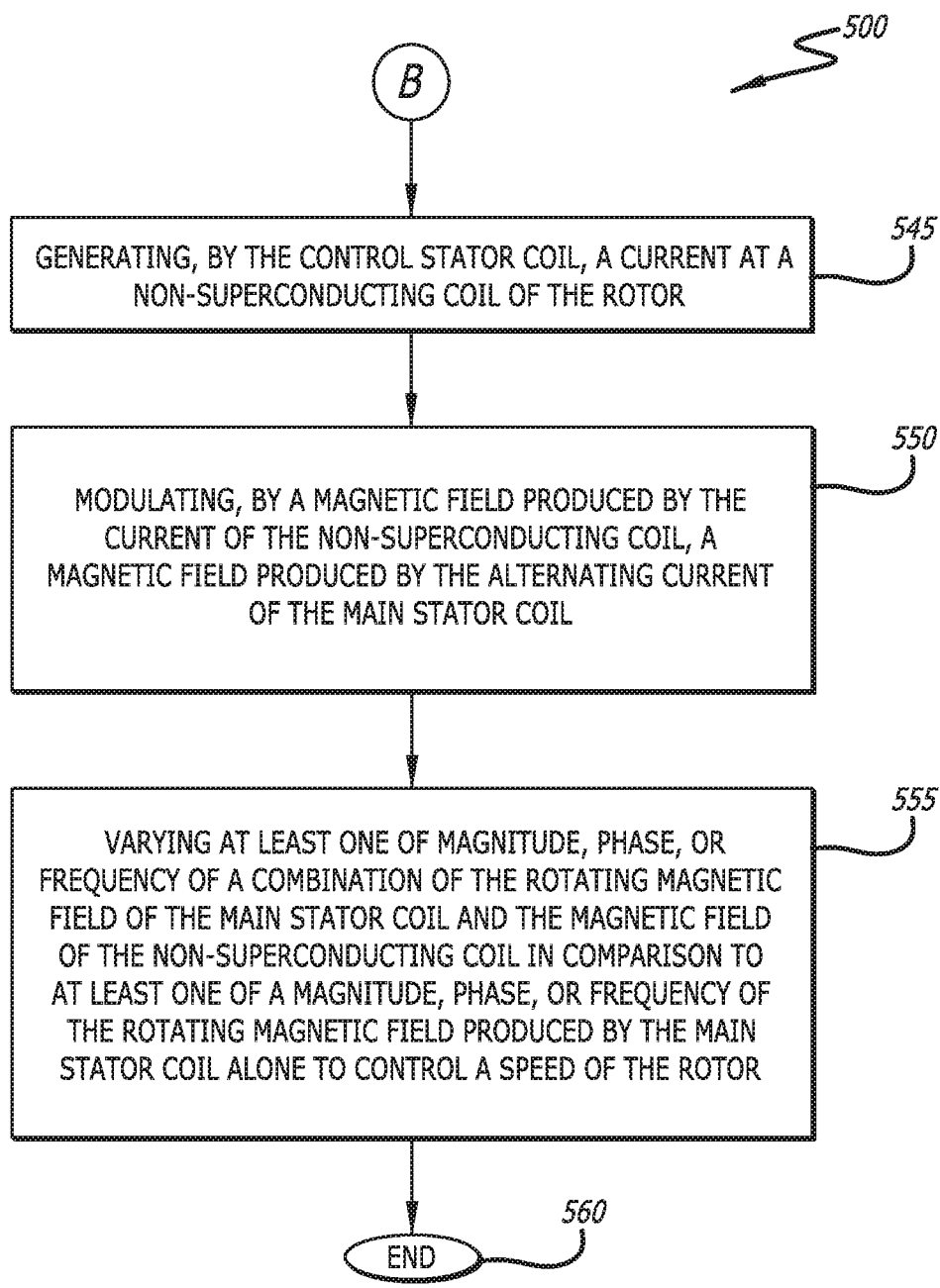

FIGS. 5A and 5B together are a flow chart showing the disclosed method for operation of the disclosed hybrid wound-rotor motor/generator (M/G) in a motor mode, in accordance with at least one embodiment of the present disclosure.

Figure 6:
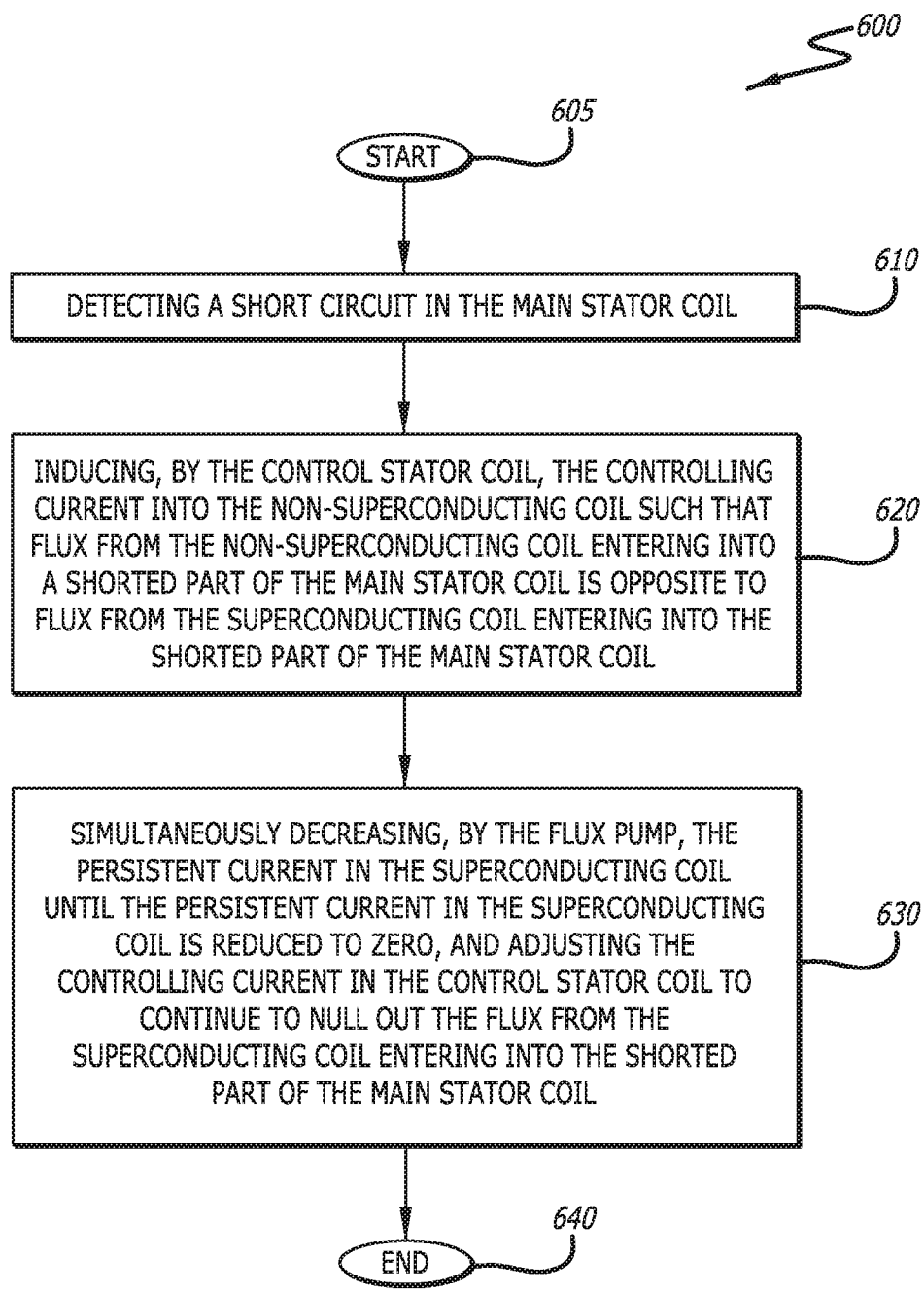

FIG. 6 is a flow chart showing the disclosed method for stator-coil short circuit operation of the disclosed hybrid wound-rotor motor/generator (M/G), in accordance with at least one embodiment of the present disclosure.

DESCRIPTION

The methods and apparatus disclosed herein provide an operative system for a hybrid wound-rotor motor/generator with induction feed and persistent current. In one or more embodiments, the system of the present disclosure provides a brushless motor/generator (M/G) that uses a wound rotor consisting of a hybrid induction-fed component and a persistent-current superconducting component to achieve high specific power and speed control. The persistent current is achieved with a magnetic flux pump. Additional advantages of the concept are a low-inductance, high-current rotor that is easy to de-energize in case of a stator short, and the ability to decrease the voltage on the shorted stator during de-energizing of the rotor.

The system of the present disclosure employs a wound rotor that is superconducting. Brushes are avoided by energizing the windings with a magnetic flux pump, which is a noncontact controlled method of inducing current into the windings. Since this will occur on initial energizing of the M/G and occurs only over a limited part of the windings, it does not suffer from the extended heating that a conventional induction process does. It should be noted that the flux pump can be operated in reverse to relatively quickly de-energize the rotor windings. This allows the design to have a low-inductance, high-current rotor, without the attendant heat load that a brushed system would have.

The rotor also uses conventional non-superconducting windings in an induction mode. The magnetic field from these induction-fed coils is linked with the magnetic field from the superconducting windings into the stator coils. Under normal operation, these coils can act in tandem with the superconducting windings to increase the power of the M/G. If a short circuit in the stator windings occurs, these coils can act in opposition to the superconducting coils to cancel out all or part of the magnetic field going into the stator to avoid any safety issue.

In addition to the abovementioned advantages, the hybrid rotor scheme also has the ability to control the output of the M/G to match the load requirements under varying input conditions. In generator mode, if there is a variable speed in the mechanical shaft turning the rotor, the induction part of the system can be used to maintain a constant frequency output. In motor mode, the induction part of the system can be used to better regulate the changing speed requirements. These advantages are similar to those of a doubly-fed induction motor.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to rotor motor/generators (M/Gs), and other functional aspects of the system (and the individual operating components of the systems) may not be described in detail herein. Most motor/generators (M/Gs) have three (3) or more electrical phases. In the disclosed systems of the present disclosure, only one electrical phase is shown. However, the disclosed systems may have more than one electrical phase. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

Figure 1:
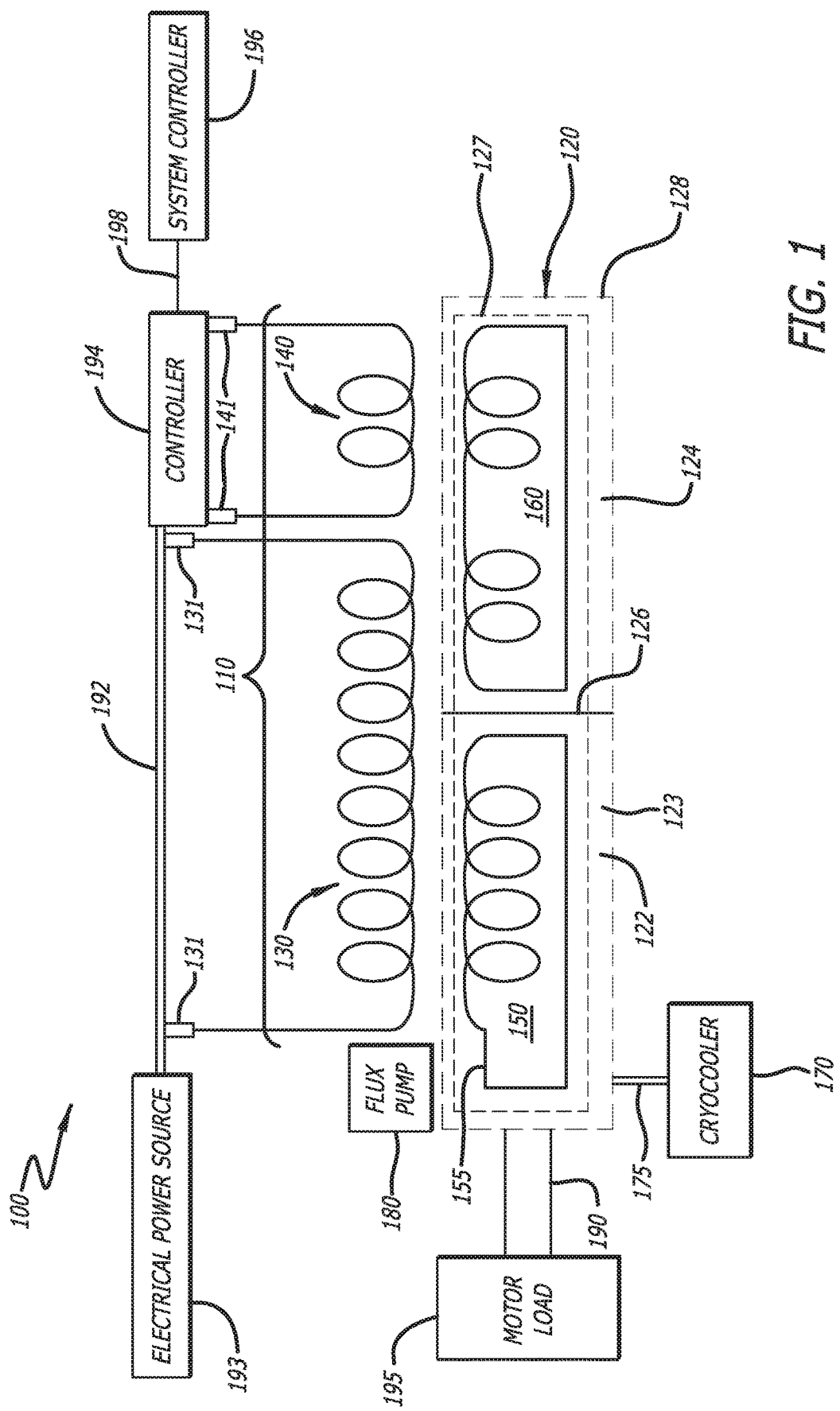
FIG. 1 is a diagram showing the disclosed system for a hybrid wound-rotor motor/generator (M/G) operating in a motor mode, where the associated cryocooler is stationary, in accordance with at least one embodiment of the present disclosure.

FIG. 1 is a diagram showing the disclosed system (or device) 100 for a hybrid wound-rotor motor/generator (M/G) operating in a motor mode, where the associated cryocooler 170 is stationary, in accordance with at least one embodiment of the present disclosure. In particular, the basic configuration for the system 100 is shown schematically in FIG. 1. Most motor/generators (M/Gs) have multiple modes of operation. In FIG. 1, the disclosed system 100 is operating in a motor mode to rotate a rotor 120.

In FIG. 1, system 100 comprises a stator 110 and the rotor 120. The stator 110 comprises a main stator coil 130 and a control stator coil 140. The rotor 120 comprises a persistent-current superconducting coil 150 and a non-superconducting coil 160. The superconducting coil 150 interacts only with the main stator coil 130. The control stator coil 140 interacts only with the non-superconducting coil 160. The non-superconducting coil 160 interacts with both stator coils (i.e. the main stator coil 130 and the control stator coil 140). And, the main stator coil 130 interacts with both rotor coils (i.e. the superconducting coil 150 and the non-superconducting coil 160).

The rotor 120 is divided into two parts: a cold part 123 and a warm part 124. The two parts are separated by an insulating partition 126. The superconducting coil 150 is located in the cold part 123 of the rotor 120, and the non-superconducting coil 160 is located in the warm part 124 of the rotor 120.

The rotor 120 also comprises an inner mechanical shell 127 that supports the rotor coils (i.e. the superconducting coil 150 and the non-superconducting coil 160). In addition, the rotor 120 comprises an outer mechanical shell 128, that together with the inner mechanical shell 127, forms a space 122, which a cooling gas may flow into or out of from passage 175, which is connected to the cryocooler 170.

In the configuration of FIG. 1, the cryocooler 170 is stationary. For convenience (e.g., for ease of illustration), passage 175 is shown in FIG. 1 to connect to the rotor 120 on the outer radius, but passage 175 would preferably connect along the rotational axis of the rotor 120. The cryocooler 170 may be powered by inductive power transfer. In other embodiments, when the cryocooler 170 is located on the rotor 120 (refer to FIG. 3), the cryocooler 170 may be powered by slip rings 377.

It should be noted that additional motor/generator components, such as support bearings, coil bobbins, cooling of the stator coil, etc., are not shown in FIG. 1. In addition, it should be noted that the inner shell 127 and the outer shell 128 may be mechanically connected by other components besides the insulating partition 126 as shown.

Superconducting coil 150 comprises a segment 155 that interacts with a flux pump 180 to induce a persistent current into superconducting coil 150. The main electrical interaction is between superconducting coil 150 and main stator coil 130. When the superconducting coil 150 electrically interacts with the main stator coil 130, the superconducting coil 150 acts as a constant source of magnetic flux. The superconducting coil 150 interacts mostly synchronously (or asynchronously) with the main stator coil 130.

The control stator coil 140 induces current into non-superconducting coil 160 in such a way that the non-superconducting coil 160 either acts to reinforce the voltage produced in main stator coil 130 by superconducting coil 150 or may act against it, or may act to change the effective phase of the interaction. As such, the controlling current controls the non-superconducting coil 160 to one of: reinforce a voltage produced in the main stator coil 130 by the superconducting coil 150, suppress the voltage produced in the main stator coil 130 by the superconducting coil 150, or change a phase of the voltage produced in the main stator coil 130 by the superconducting coil 150.

In one or more embodiments, the stator coils (i.e. main stator coil 130 and control stator coil 140) may be superconducting or non-superconducting.

In FIG. 1, the flux pump 180 is shown located axially of the rotor 120. In a separate embodiment of the invention (refer to FIG. 3), the flux pump 180 is located radially of the rotor 120.

In addition, in FIG. 1, a motor load (e.g., a propeller) 195 is shown to be connected to the rotor 120 via a shaft 190. During operation of the system 100 in motor mode, the rotor rotates to drive the motor load 195.

Also shown in FIG. 1, the main stator coil 130 is connected via main stator coil terminals 131 to an external power distribution bus 192. An electrical power source 193 delivers power to the power distribution bus 192. In addition, the control stator coil 140 is connected via control stator coil terminals 141 to a controller 194. A system controller 196 is connected to the controller 194, and sends at least one control signal 198 to control the control stator coil 140.

Figure 2:
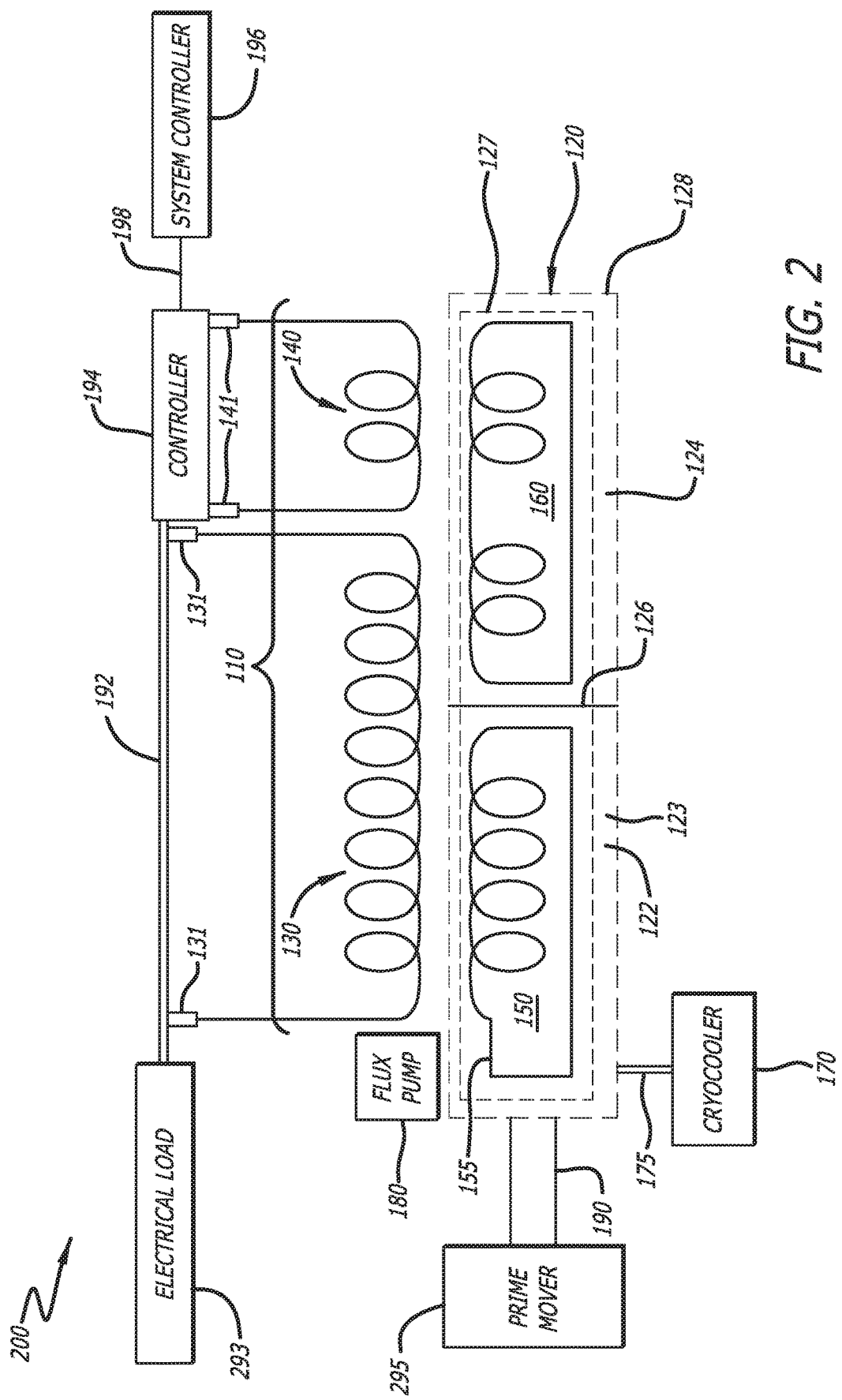
FIG. 2 is a diagram showing the disclosed system for a hybrid wound-rotor motor/generator (M/G) operating in a generator mode, where the associated cryocooler is stationary, in accordance with at least one embodiment of the present disclosure.

FIG. 2 is a diagram showing the disclosed system (or device) 200 for a hybrid wound-rotor motor/generator (M/G) operating in a generator mode, where (similar to FIG. 1) the associated cryocooler 170 is stationary, in accordance with at least one embodiment of the present disclosure. Most of the components of the system 200 of FIG. 2 are the same as the components of the system 100 of FIG. 1, which shows the basic configuration. In FIG. 2, the disclosed system 200 is operating in a generator mode to produce an output voltage.

In FIG. 2, a prime mover 295 is shown to be connected to the rotor 120 via the shaft 190. During operation of the system 200 in generator mode, the shaft 190 of the prime mover 295 delivers torque to rotate the rotor 120. The output voltage produced is outputted at the main stator coil terminals 131. The main stator coil 130 is connected to (via the main stator coil terminals 131) and delivers power to the power distribution bus 192. The power distribution bus 192 is connected to an electrical load 293, which receives the power.

Figure 3:
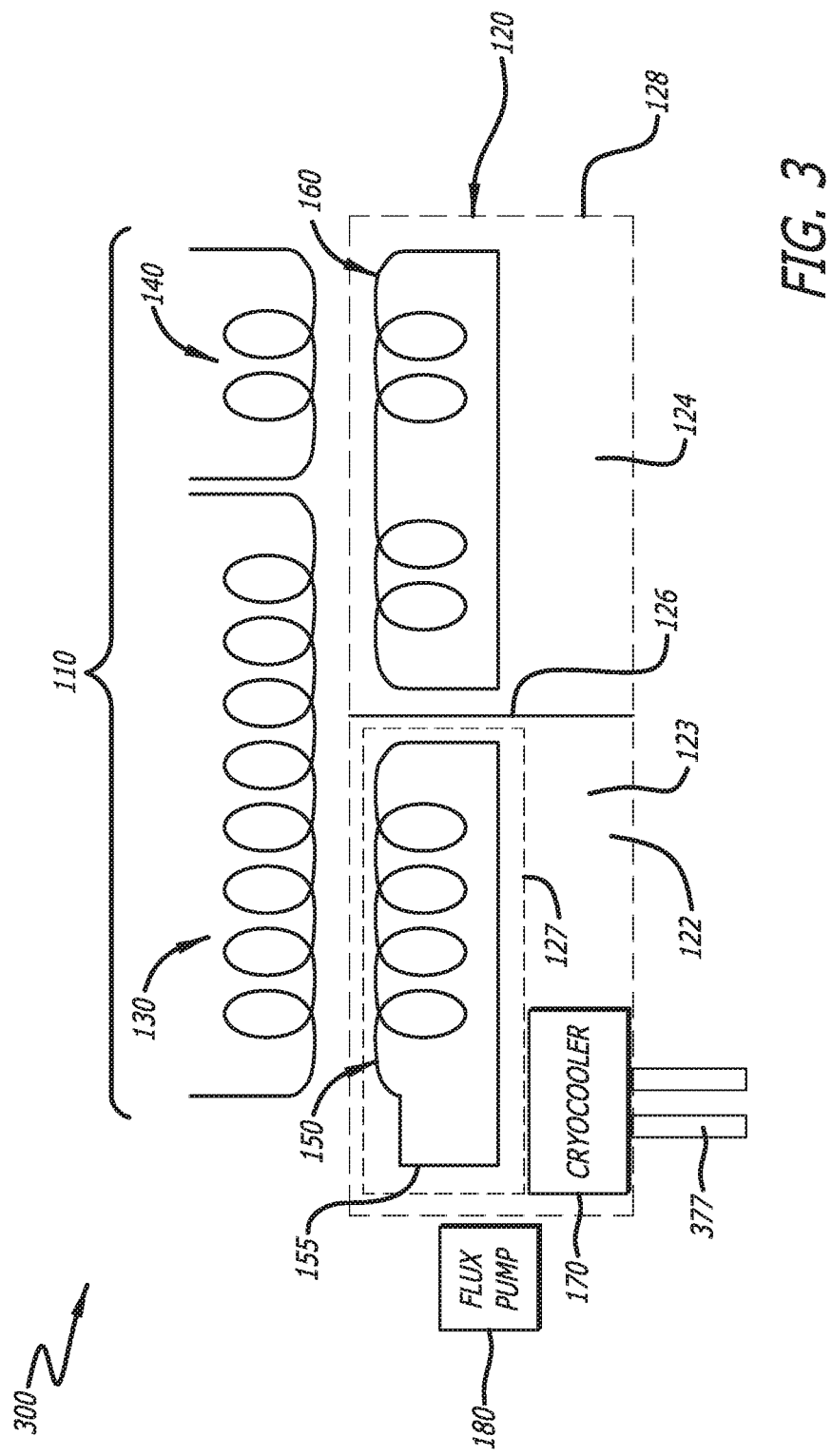
FIG. 3 is a diagram showing the disclosed system for a hybrid wound-rotor motor/generator (M/G), where the associated cryocooler is located on the rotor, in accordance with at least one embodiment of the present disclosure.

FIG. 3 is a diagram showing the disclosed system (or device) 300 for a hybrid wound-rotor motor/generator (M/G), where the associated cryocooler 170 is located on the rotor 120, in accordance with at least one embodiment of the present disclosure. For convenience (e.g., for ease of illustration), not all of the components of the disclosed system 300 are illustrated in FIG. 3. Refer to FIGS. 1 and 2 to view all of the components of the system 300.

In particular, FIG. 3 shows another embodiment of the disclosed system 300, in which for system 300, the cryocooler 170 is located on the rotor 120. In addition, the embodiment of FIG. 3 also shows the flux pump 180 located radially of the rotor 120.

In this configuration, the cryocooler 170 may conductively cool the superconducting coil 150. In this case, the cryocooler 170 is powered by slip rings 377. Alternatively, as previously mentioned above, the cryocooler 170 may be powered by inductive power transfer, similar to the charging of electric cars.

FIGS. 4A and 4B together are a flow chart showing the disclosed method 400 for operation of the disclosed hybrid wound-rotor motor/generator (M/G) (e.g., system (or device) 200 of FIG. 2) in a generator mode, in accordance with at least one embodiment of the present disclosure. When operating in a generator mode, the disclosed hybrid wound-rotor motor/generator (M/G) operates as a generator to produce an output voltage. For the method of FIGS. 4A and 4B, refer to the components shown in FIG. 2.

At the start 405 of the method, at step 410, a cryocooler 170 cools a superconducting coil 150 of a rotor 120 until a temperature of the windings of the superconducting coil 150 is at a superconducting operating temperature (e.g., a predetermined operating temperature for the superconducting coil 150). At step 415, a flux pump 180 provides flux to the superconducting coil 150 until a persistent current flowing through the windings of the superconducting coil 150 is at a persistent operating current (e.g., a predetermined persistent operating current). At step 420, a shaft 190 of a prime mover 295 receives torque to rotate the rotor 120.

At step 425, the persistent current of the superconducting coil 150 generates a rotating magnetic field. At step 430, the superconducting coil 150 electrically interacts with a main stator coil 130 through the rotating magnetic field. At step 435, the rotating magnetic field of the superconducting coil 150 coupled with the main stator coil 130 generates an electromotive force (EMF) within the main stator coil 130.

At step 440, a control stator coil 140 receives a current from a controller 194. At step 445, the control stator coil 140 electrically interacts with a non-superconducting coil 160 of the rotor 120. At step 450, a magnetic field of a current of the control stator coil 140 induces a controlling current within the non-superconducting coil 160. At step 455, the controlling current within the non-superconducting coil 160 generates a magnetic field to couple with the main stator coil 130. At step 460, the magnetic field produced by the controlling current within the non-superconducting coil 160 modulates a magnetic field produced by the superconducting coil 150.

At step 465, at least one of a magnitude, phase, or frequency of a combination of rotating magnetic fields of the superconducting coil 150 and the non-superconducting coil 160 is varied in comparison to at least one of a magnitude, phase, or frequency of the magnetic field produced by the superconducting coil 150 alone to control at least one of magnitude, phase, or frequency of an output voltage. Then, the method ends at 470.

FIGS. 5A and 5B together are a flow chart showing the disclosed method 500 for operation of the disclosed hybrid wound-rotor motor/generator (M/G) (e.g., system (or device) 100 of FIG. 1) in a motor mode, in accordance with at least one embodiment of the present disclosure. When operating in a motor mode, the disclosed hybrid wound-rotor motor/generator (M/G) operates as a motor to rotate the rotor 120. For the method of FIGS. 5A and 5B, refer to the components shown in FIG. 1.

At the start 505 of the method, at step 510, a cryocooler 170 cools a superconducting coil 150 of a rotor 120 until a temperature of windings of the superconducting coil 150 is at a superconducting operating temperature (e.g., a predetermined operating temperature). At step 515, a flux pump 180 provides flux to the superconducting coil 150 until a persistent current flowing through the windings of the superconducting coil 150 is at a persistent operating current.

At step 520, a main stator coil 130 receives an alternating current (AC) input from a power distribution bus 192. At step 525, a control stator coil 140 receives a control current from a controller 194. At step 530, an alternating current (AC) within the main stator coil 130 generates a rotating magnetic field. At step 535, the rotating magnetic field electrically interacts with the persistent current of the superconducting coil 150. At step 540, the rotating magnetic field interacting with the persistent current generates an electromagnetic torque to rotate the rotor 120.

At step 545, the control stator coil 140 generates a current at a non-superconducting coil 160 of the rotor 120. At step 550, a magnetic field produced by the current of the non-superconducting coil 160 modulates a magnetic field produced by the alternating current (AC) of the main stator coil 130. At step 555, at least one of a magnitude, phase, or frequency of a combination of the rotating magnetic field of the main stator coil 130 and the magnetic field of the non-superconducting coil 160 is varied in comparison to at least one of a magnitude, phase, or frequency of the rotating magnetic field produced by the main stator coil 130 alone to control a speed of the rotor 120. Then, the method ends at 560.

FIG. 6 is a flow chart showing the disclosed method 600 for stator-coil short circuit operation of the disclosed hybrid wound-rotor motor/generator (M/G) (e.g., systems (or devices) 100, 200 of FIGS. 1 and 2), in accordance with at least one embodiment of the present disclosure. When the disclosed hybrid wound-rotor motor/generator (M/G) is operating in a motor mode or a generator mode, a short circuit may occur in the main stator coil 130. The method of FIG. 6 is utilized to null out the flux entering into the shorted part of the main stator coil 130. For the method of FIG. 6, refer to the components shown in FIGS. 1 and 2.

At the start 605 of the method, at step 610, a short circuit is detected in the main stator coil 130. At step 620, the control stator coil 140 induces the controlling current into the non-superconducting coil 160 such that flux from the non-superconducting coil 160 entering into the shorted part of the main stator coil 130 is opposite to flux from the superconducting coil 150 entering into the shorted part of the main stator coil 130. At step 630, the flux pump 180 simultaneously decreases the persistent current in the superconducting coil 150 until the persistent current in the superconducting coil 150 is reduced to zero, and during this time, the controlling current in the control stator coil 140 is adjusted to continue to null out the flux in the superconducting coil 150 entering into the shorted part of the main stator coil 130. Then, the method ends 640.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for operation of a device in a generator mode, the method comprising:
   cooling, with a cryocooler, a superconducting coil of a rotor until a temperature of windings of the superconducting coil is at a superconducting operating temperature;
   providing, by a flux pump, flux to the superconducting coil until a persistent current flowing through the windings of the superconducting coil is at a persistent operating current;
   receiving, from a shaft of a prime mover, torque to rotate the rotor;
   generating, by the persistent current of the superconducting coil, a rotating magnetic field;
   electrically interacting, by the superconducting coil, with a main stator coil through the rotating magnetic field;
   generating, through the rotating magnetic field of the superconducting coil coupled with the main stator coil, an electromotive force (EMF) within the main stator coil;
   receiving, by a control stator coil, a current from a controller;
   electrically interacting, by the control stator coil, with a non-superconducting coil of the rotor;
   inducing, by a magnetic field of a current of the control stator coil, a controlling current within the non-superconducting coil;
   generating, by the controlling current within the non-superconducting coil, a magnetic field to couple with the main stator coil;
   modulating, by the magnetic field produced by the controlling current within the non-superconducting coil, a magnetic field produced by the superconducting coil; and
   varying at least one of magnitude, phase, or frequency of a combination of rotating magnetic fields of the superconducting coil and the non-superconducting coil in comparison to at least one of a magnitude, phase, or frequency of the magnetic field produced by the superconducting coil alone to control at least one of magnitude, phase, or frequency of an output voltage.

2. The method of claim 1, wherein the main stator coil is connected to and delivers electric power to a power distribution bus.

3. The method of claim 1, wherein control stator coil terminals are connected to the controller.

4. The method of claim 1, wherein the control stator coil is connected to the controller and receives at least one control signal from a system controller.

5. The method of claim 1, wherein the output voltage is outputted at main stator coil terminals.

6. The method of claim 1, wherein when the superconducting coil electrically interacts with the main stator coil, the superconducting coil acts as a constant source of magnetic flux.

7. The method of claim 1, wherein the superconducting coil electrically interacts mostly synchronously with the main stator coil.

8. The method of claim 1, wherein the superconducting coil electrically interacts asynchronously with the main stator coil.

9. The method of claim 1, wherein the main stator coil is one of superconducting or non-superconducting.

10. The method of claim 1, wherein the control stator coil is one of superconducting or non-superconducting.

11. The method of claim 1, wherein the flux pump is located one of axially of the rotor or radially of the rotor.

12. The method of claim 1, wherein the cryocooler is one of located on the rotor or is stationary.

13. The method of claim 1, wherein the method further comprises powering, by slip rings, the cryocooler, when the cryocooler is located on the rotor.

14. The method of claim 1, wherein the method further comprises powering, by inductive power transfer, the cryocooler.

15. The method of claim 1, wherein the method further comprises flowing, from the cryocooler via a passage, a cooling gas to a cold part of the rotor that comprises the superconducting coil.

16. The method of claim 15, wherein the passage connects from the cryocooler to one of an outer radius of the rotor or a rotational axis of the rotor.

17. The method of claim 1, wherein the controlling current controls the non-superconducting coil to one of: reinforce a voltage produced in the main stator coil by the superconducting coil, suppress the voltage produced in the main stator coil by the superconducting coil, or change a phase of the voltage produced in the main stator coil by the superconducting coil.

18. The method of claim 1, wherein the method further comprises:
   detecting a short circuit in the main stator coil;
   inducing, by the control stator coil, the controlling current into the non-superconducting coil such that flux from the non-superconducting coil entering into a shorted part of the main stator coil is opposite to flux from the superconducting coil entering into the shorted part of the main stator coil; and
   simultaneously decreasing, by the flux pump, the persistent current in the superconducting coil until the persistent current in the superconducting coil is reduced to zero, and adjusting the controlling current in the control stator coil to continue to null out the flux from the superconducting coil entering into the shorted part of the main stator coil.

19. The method of claim 1, wherein the superconducting coil is located in a cold part of the rotor and the non-superconducting coil is located in a warm part of the rotor.

20. The method of claim 19, wherein the cold part of the rotor and the warm part of the rotor are separated by an insulating partition.

21. The method of claim 1, wherein the rotor comprises an outer mechanical shell and an inner mechanical shell, and wherein a cooling gas from the cryocooler flows in a space formed between the outer mechanical shell and the inner mechanical shell.

22. A system for operation in a generator mode, the system comprising:
   a cryocooler to cool a superconducting coil of a rotor until a temperature of windings of the superconducting coil is at a superconducting operating temperature;
   a flux pump to provide flux to the superconducting coil until a persistent current flowing through the windings of the superconducting coil is at a persistent operating current;
   a shaft of a prime mover to receive torque to rotate the rotor, wherein the persistent current of the superconducting coil generates a rotating magnetic field;
   the superconducting coil to electrically interact with a main stator coil through the rotating magnetic field, wherein the rotating magnetic field of the superconducting coil coupled with the main stator coil generates an electromotive force (EMF) within the main stator coil; and a control stator coil to receive a current from a controller and to electrically interact with a non-superconducting coil of the rotor, wherein a magnetic field of a current of the control stator coil induces a controlling current within the non-superconducting coil, wherein the controlling current within the non-superconducting coil generates a magnetic field to couple with the main stator coil, and wherein the magnetic field produced by the controlling current within the non-superconducting coil modulates a magnetic field produced by the superconducting coil, and wherein at least one of magnitude, phase, or frequency of a combination of rotating magnetic fields of the superconducting coil and the non-superconducting coil varies in comparison to at least one of a magnitude, phase, or frequency of the magnetic field produced by the superconducting coil alone to control at least one of magnitude, phase, or frequency of an output voltage.

\* \* \* \* \*